United States Patent
Fukumura

[19]

[11] Patent Number: 5,953,262
[45] Date of Patent: Sep. 14, 1999

[54] OUTPUT CIRCUIT OF A SEMICONDUCTOR MEMORY DEVICE FOR PROVIDING AN INTERMEDIATE POTENTIAL TO AN OUTPUT TERMINAL

[75] Inventor: Keiji Fukumura, Hyogo, Japan

[73] Assignee: Ricoh Company, Ltd., Tokyo, Japan

[21] Appl. No.: 09/109,840

[22] Filed: Jul. 2, 1998

[30] Foreign Application Priority Data

Jul. 4, 1997 [JP] Japan .................................. 9-179241

[51] Int. Cl.$^6$ ........................................................ G11C 7/00
[52] U.S. Cl. ...................................... 365/189.05; 365/149
[58] Field of Search ................................ 365/189.05, 149, 365/191; 326/56, 57, 58, 93

[56] References Cited

U.S. PATENT DOCUMENTS

| | | |
|---|---|---|
| 4,604,731 | 8/1986 | Konishi . |
| 4,774,692 | 9/1988 | Oishi et al. . |
| 5,638,326 | 6/1997 | Hollmer et al. ............... 365/189.05 |
| 5,796,661 | 8/1998 | Kim .................................. 365/189.05 |

FOREIGN PATENT DOCUMENTS

| | | |
|---|---|---|
| 58-194195 | 11/1983 | Japan . |
| 467392 | 3/1992 | Japan . |
| 4255990 | 9/1992 | Japan . |

*Primary Examiner*—Vu A. Le
*Attorney, Agent, or Firm*—Cooper & Dunham LLP

[57] ABSTRACT

An output circuit for a semiconductor memory device sets an intermediate potential supplied to an output terminal to a value greater than the minimum potential defining the high-level potential or smaller than the maximum potential defining the low-level potential. A pulse outputting circuit outputs a pulse when the data output terminal is set to a high-impedance state. A potential switching circuit changes a potential of a data output terminal to the intermediate potential before the potential at the data output terminal is switched from one of the high-level potential and the low-level potential to the other when the pulse signal is supplied by the pulse outputting circuit. The intermediate potential is held by a capacitance of the data output terminal. The intermediate potential is set to a level within an allowable range for a level of one of the high-level potential and the low-level potential.

9 Claims, 4 Drawing Sheets

OUTPUT CIRCUIT OF A SEMICONDUCTOR MEMORY DEVICE FOR PROVIDING AN INTERMEDIATE POTENTIAL TO AN OUTPUT TERMINAL

BACKGROUND OF THE INVENTION

1. Field of the Invention

The present invention generally relates to an output circuit and, more particularly, to an output circuit provided in a data output section of a semiconductor memory device.

2. Description of the Related Art

An output circuit of a conventional semiconductor memory device is constructed so that a state thereof is shifted from an immediately preceding information outputting state to a state for outputting information at a newly designated address. In such a structure, the information outputting state of the output circuit must be completely changed from a high-level state to a low-level state or vice versa. Such a change in the outputting state is referred to as a full swing. There is a problem in that the full-swing operation tends to generate an undesired noise.

In order to eliminate above-mentioned problem, Japanese Laid-Open Patent Application No.4-67392 discloses a semiconductor memory device in which output pins (output terminals) are short circuited during a high-impedance state when the output thereof is switched so that all of the output pins are set to the same intermediate potential. In this structure, a noise is reduced as compared to that of the full swing since switching operations are always from the intermediate potential. Additionally, Japanese Laid-Open Patent Application No.4-255990 discloses a semiconductor memory device having a circuit for generating an intermediate potential. In this structure, an output pin whose output is to be switched is connected to a point having the intermediate potential output from the intermediate potential output circuit immediately before the output is switched. Further, Japanese Laid-Open Patent Application No.58-194195 discloses an output circuit of a semiconductor memory device provided with a reference voltage and an inverting amplifier in which an output voltage is controlled to be an intermediate potential immediately before the output voltage is switched.

In the techniques disclosed in the above-mentioned patent documents, an output buffer is set in a high-impedance state during a period from an input of an address till a fixation of an output. However, since an intermediate potential between a high-level output voltage $V_{OH}$ and a low-level output voltage $V_{OL}$ is provided to the data output terminal, there is a problem in that an output holding time $t_{OH}$ is decreased. Additionally, if such an intermediate potential value is set, there is a problem in that a current (for example, a current flowing between a P-channel type transistor and an N-channel type transistor of a MOS circuit) flowing in an input part of a circuit which operates upon receipt of a signal from the data output terminal is increased. On the other hand, if a potential value greater than $V_{OH}$ but smaller than $V_{CC}$ is set as the intermediate potential value, the problem related to such a current can be eliminated. However, if such an intermediate potential value is set irrespective of immediately preceding data, another problem may occur in that an operation current is increased when the immediately preceding data is low level data and the present data is also low level data since the potential of the output terminal at the low level is once increased to a level higher than $V_{OH}$ and decreased to the low-level. The same problem also occurs if a value smaller than $V_{OL}$ and greater than GND is set as the intermediate potential value and if the immediately preceding data is high-level data and the present data is also high-level data.

U.S. Pat. No. 4,604,731 discloses an output circuit for a semiconductor memory device which has a preset circuit connected to a data output terminal so as to adjust the potential of the data output terminal. In this output circuit, a potential level of the data output terminal reaches a high level or a low level by adjusting the potential of the output terminal to a potential intermediate between a first potential supply terminal and a second potential supply terminal during a preset period prior to a data readout from a memory cell. In this structure, an intermediate potential value provided to the output terminal is determined in response to the output value before the address is changed. However, since a preset voltage which determines the preset period is determined by a pulse width of a read control signal, it is difficult to set the intermediate potential to be higher than a high-level potential $V_{OH}$ or lower than a low-level potential $V_{OL}$.

SUMMARY OF THE INVENTION

It is a general object of the present invention to provide an improved and useful output circuit in which the above-mentioned problems are eliminated.

A more specific object of the present invention is to provide an output circuit for a semiconductor memory device which can set an intermediate potential value supplied to an output terminal to a value greater than the minimum potential defining the high-level potential or smaller than the maximum potential defining the low-level potential in response to an output value immediately before the address is changed.

In order to achieve the above-mentioned objects, there is provided according to the present invention an output circuit outputting data represented by one of a high-level potential and a low-level potential, the output circuit having a data input terminal, a data output terminal and an output buffer circuit provided between the data input terminal and the data output terminal, an output of the output buffer circuit being connected to the data output terminal, the data output terminal being set to a high-impedance state for a predetermined period when the output buffer circuit switches a potential at the data output terminal, the output circuit comprising:

a pulse outputting circuit outputting a pulse when the data output terminal is set to the high-impedance state; and a potential switching circuit changing a potential of the data output terminal to an intermediate potential before the potential at the data output terminal is switched from one of the high-level potential and the low-level potential to the other when the pulse signal is supplied by the pulse outputting circuit so that the intermediate potential is held by a capacitance of the data output terminal, the intermediate potential being set to a level within an allowable range for a level of one of the high-level potential and the low-level potential.

According to the above-mentioned invention, the intermediate potential can be set to a level which does not change a logic level of the data having been output from the data output terminal. Thus, there is no problem in that the output holding time for the data output from the data output terminal is reduced. Additionally, there is no problem in that a current flows in an input part of a circuit which receives the signal from the data output terminal. Further, since the intermediate potential is responsive to the output value before the address change, there is no problem in that the operation current is increased which tends to occur in the structure in which the intermediate potential is set to a fixed value without being responsive to the output value before an address change. Additionally, there is no problem occurring in the conventional circuit which uses a preset potential determined by a pulse width (preset period) of a read control signal for a memory as the intermediate potential. That is, a problem can be eliminated in which it is difficult to set the intermediate potential within a range in which the logic level is not changed due to the fact that the preset potential, which is rendered to be the intermediate potential, is determined by the preset period.

In one embodiment of the present invention, the intermediate potential may be higher than a lowest level defining the high-level potential and lower than a potential of a power source.

Accordingly, when the high-level potential data is switched to the low-level potential data, the potential at the data output terminal is changed from the high-level potential to the intermediate potential, and then changed to the low-level potential.

Additionally, in one embodiment of the present invention, the output buffer circuit may comprise a P-channel transistor and an N-channel transistor so as to change the potential at the data output terminal to the high-level potential by operating the P-channel transistor and change the potential at the data output terminal to the low-level potential by operating the N-channel transistor; the pulse outputting circuit may generate the pulse for a predetermined period shorter than a period of the high-impedance state in synchronization with a rising of a signal input to a gate of the P-channel transistor; and the potential switching circuit may discharge a charge maintained by the capacitance of the data output terminal when the pulse is supplied thereto.

In the above-mentioned structure, the potential switching circuit may comprise:

an inverter circuit comprising a P-channel transistor and an N-channel transistor connected in series in that order between a power source and a ground, the pulse output from the pulse outputting circuit being input to an input of the inverter circuit;

a pull-up circuit provided between the power source and an output of the inverter circuit so as to provide a predetermined potential to the output of the inverter circuit; and a discharging circuit provided between the output of the inverter circuit and the output of the output buffer circuit so as to discharge the charge held by the capacitance of the data output terminal so that the potential at the data output terminal is changed to the intermediate potential.

Additionally, in the output circuit according to the present invention, the output buffer circuit may comprise a P-channel transistor and an N-channel transistor so as to change the potential at the data output terminal to the high-level potential by operating the P-channel transistor and change the potential at the data output terminal to the low-level potential by operating the N-channel transistor; the pulse outputting circuit may generate the pulse having a predetermined width in synchronization with a rising of a signal input to a gate of the P-channel transistor; and the potential switching circuit may comprise a plurality of N-channel transistors, the potential switching circuit being activated by the pulse being input to a gate of one of the N-channel transistors so as to discharge a charge held by the capacitance of the data output terminal based on threshold potentials of the N-channel transistors.

According to this invention, the intermediate potential can be adjusted to a desired level by adjusting the width of the pulse which is determined by threshold potentials of the N-channel transistors provided in the potential switching circuit.

Additionally, in one embodiment of the output circuit according to the present invention, the intermediate potential may be lower than a highest level defining the low-level potential and higher than a ground level.

Accordingly, when the low-level potential data is switched to the high-level potential data, the potential at the data output terminal is changed from the low-level potential to the intermediate potential, and then changed to the high-level potential.

Additionally, the output buffer circuit may comprise a P-channel transistor and an N-channel transistor so as to change the potential at the data output terminal to the high-level potential by operating the P-channel transistor and change the potential at the data output terminal to the low-level potential by operating the N-channel transistor; the pulse outputting circuit may generate the pulse for a predetermined period shorter than a period of the high-impedance state in synchronization with a falling of a signal input to a gate of the N-channel transistor; and the potential switching circuit may charge the capacitance of the data output terminal when the pulse is supplied thereto.

Additionally, the potential switching circuit may comprise:

an inverter circuit comprising a P-channel transistor and an N-channel transistor connected in series in that order between a power source and a ground, the pulse output from the pulse outputting circuit being input to an input of the inverter circuit;

a potential setting circuit provided between the ground and an output of the inverter circuit so as to set the output of the inverter circuit to a predetermined potential; and a charging circuit provided between the output of the inverter circuit and the output of the output buffer circuit so as to charge the capacitance of the data output terminal based on the predetermined potential so that the potential at the data output terminal is changed to the intermediate potential.

Additionally, in the output circuit according to the present invention, the output buffer circuit may comprise a P-channel transistor and an N-channel transistor so as to change the potential at the data output terminal to the high-level potential by operating the P-channel transistor and change the potential at the data output terminal to the low-level potential by operating the N-channel transistor; the pulse outputting circuit may generate the pulse having a predetermined width in synchronization with a falling of a signal input to a gate of the N-channel transistor; and the potential switching circuit may comprise a plurality of P-channel transistors, the potential switching circuit being activated by the pulse being input to a gate of one of the P-channel transistors so as to charge the capacitance of the data output terminal based on threshold potentials of the P-channel transistors.

According to this invention, the intermediate potential can be adjusted to a desired level by adjusting the width of the pulse which is determined by threshold potentials of the P-channel transistors provided in the potential switching circuit.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to FIGS. 1 to 3, of a first embodiment of the present invention. The first embodiment is related to a structure which operates for a condition in which high-level data is switched to low-level data.

Figure 1:
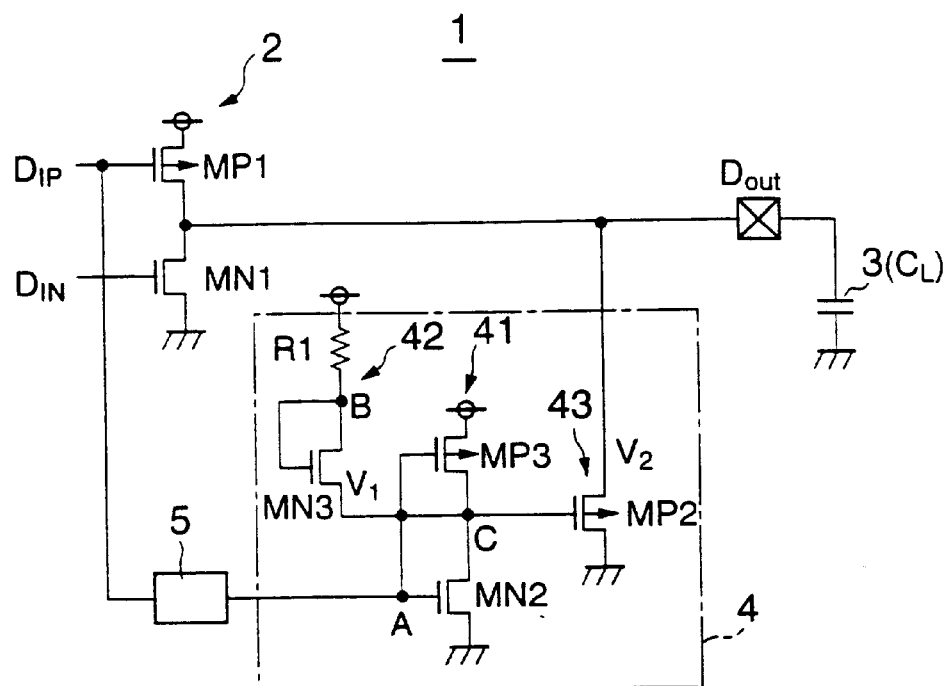
FIG. 1 is a circuit diagram of an output circuit according to a first embodiment of the present invention.

FIG. 1 is a circuit diagram 1 of an output circuit according to the first embodiment of the present invention. FIG. 2 is a time chart showing changes in signals at various positions in the output circuit 1 shown in FIG. 1. The output circuit 1 comprises an output buffer circuit 2, a potential switching circuit 4 and a one-shot pulse generating circuit 5. An output terminal $D_{OUT}$ (output pin) has a capacitance $C_L$. Hereinafter, for the sake of convenience, it is assumed that a capacitor 3 having the capacitance $C_L$ is connected to the output terminal $D_{OUT}$.

The output buffer circuit 2 comprises a P-channel channel MOS transistor MP1 and an N-channel MOS transistor MN1 in series, in that order, between a power source $V_{CC}$ and a ground GND. A junction between drains of the transistors MP1 and MN1 is connected to the data output terminal $D_{OUT}$. A gate of the N-channel MOS transistor MN1 is connected to a data input terminal $D_{IN}$. A gate of the P-channel MOS transistor MP1 is connected to an internal signal input terminal $D_{IP}$. In this structure, a potential of output data is changed toward the power source voltage $V_{CC}$, that is, switched to a high level, by the P-channel MOS transistor MP1, and the potential of the output data is changed toward the ground potential GND, that is, switched to a low level, by the N-channel MOS transistor MN1.

In the output buffer circuit 2, the junction between the transistors MP1 and MN1 is rendered to be in a high-impedance state during a predetermined period when switching the data. Specifically, as shown in FIG. 2-(a) and FIG. 2-(b), when the data is switched from the high level to the low level, the data input terminal $D_{IN}$ is changed when a predetermined period $T_1$ is passed after the internal signal input terminal $D_{IP}$ is changed to the high level. Accordingly, both the transistors MP1 and MN1 are turned off which renders the junction between the transistors MP1 and MN1 to be in the high-impedance state. It should be noted that the high-impedance state is provided for preventing a current from flowing between the transistors MP1 and MN1, which is a generally performed operation. Additionally, the predetermined period $T_1$ is set to a period such as that obtained by subtracting a delay time of an I/O cell from an address access time for a memory.

The capacitor 3 is present so that one end thereof is connected to the data output terminal $D_{OUT}$ and the opposite end is connected to the ground GND. When the data output terminal $D_{OUT}$ is at the high level, the capacitor 3 holds the potential ($V_{CC}$). Additionally, the capacitor 3 can hold a potential $V_2$, which is lower than $V_{CC}$, by being discharged by an operation of the potential switching circuit 4. The potential $V_2$ corresponds to an intermediate potential, and the detail thereof will be described later.

Figure 2:
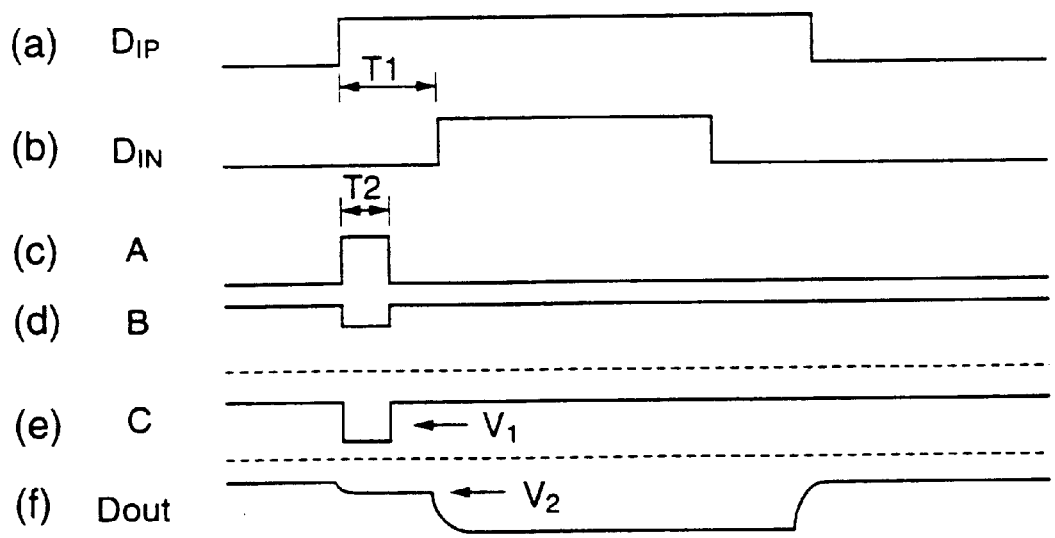
FIG. 2 is a time chart of signals at various positions in the output circuit shown in FIG. 1.
Figure 3:
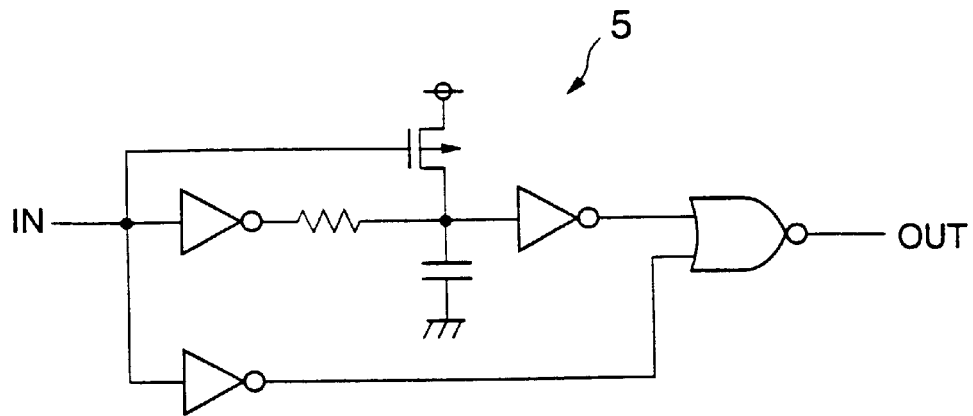
FIG. 3 is a circuit diagram of a one-shot pulse generating circuit shown in FIG. 1.

The one-shot pulse generating circuit 5 generates, as shown in FIG. 2-(c), a pulse signal in synchronization with a rising edge of a signal at the internal signal input terminal $D_{IP}$, that is, the signal input to the gate of the P-channel transistor MP1. The pulse signal has a width (duration) $T_2$ that is shorter than the period of the high-impedance state. The one-shot pulse generating circuit 5 can be achieved by various structures. FIG. 3 is a circuit diagram of an example of the one-shot pulse generating circuit 5.

The potential switching circuit 4 comprises an inverter circuit 41, a pull-up circuit 42, and an intermediate potential providing circuit 43. When the potential switching circuit 4 inputs the pulse signal from the one-shot pulse generating circuit 5, the potential switching circuit 4 sets the data output terminal $D_{OUT}$ to the intermediate potential $V_2$. Then, after the duration $T_2$ of the pulse signal is passed, the capacitor 3 holds the intermediate potential $V_2$.

The inverter circuit 41 comprises a P-channel MOS transistor MP3 and an N-channel MOS transistor circuit MN2 connected in series in that order between the power source $V_{CC}$ and the ground GND. A junction between the drains of the transistors MP3 and MN2 is rendered to be an output terminal C. A junction between the gates of the transistors MP3 and MN2 is rendered to be an input terminal A. The pulse signal of the one-shot pulse generating circuit 5 is input to the input terminal A. When the pulse signal of the one-shot pulse generating circuit 5 is not input to the terminal A, the P-channel MOS transistor MP3 is turned on. Thereby, the potential at the output terminal C is substantially equal to the potential of the power source $V_{CC}$. However, when the pulse signal (high-level signal) of the one-shot pulse generating circuit 5 is input to the input terminal A, the P-channel MOS transistor PM3 is turned off. Accordingly, the potential at the output terminal C is determined by the pull-up circuit 42.

The pull-up circuit 42 comprises a resistor R1 and an N-channel MOS transistor MN3 connected in series in that order between the power source $V_{CC}$ and the output terminal C of the inverter circuit 41. A voltage $V_1$ provided to the output terminal C by the pull-up circuit 42 is determined by a resistance of the resistor R1 and a resistance of each of the N-channel MOS transistors MN3 and MN2 when the P-channel MOS transistor MP3 is turned off and a DC current flows through a path routing the power source $V_{CC}$→the resistor R1→the N-channel MOS transistor MN3→the ground GND.

The intermediate potential providing circuit 43 comprises a P-channel MOS transistor MP2. A drain of the P-channel MOS transistor MP2 is connected to the ground GND. A gate of the p-channel MOS transistor MP2 is connected to the output terminal C. A source of the P-channel MOS transistor MP2 is connected to the output terminal of the output buffer circuit 2, that is, the data output terminal $D_{OUT}$. The intermediate voltage $V_2$, which is a potential at the data output terminal $D_{OUT}$ when the output buffer circuit 2 is in the high-impedance state, is provided by the P-channel MOS transistor MP2. Specifically, when the output terminal of the output buffer circuit 2 is in the high-impedance state, the P-channel MOS transistor MP3 is turned off and the voltage $V_1$ is provided to the gate of the P-channel MOS transistor MP2. A value obtained by summing the potential $V_1$ and a threshold value $V_{TH}$ of the P-channel MOS transistor MP2 is the potential $V_2$. The potential $V_2$ corresponds to the intermediate potential which does not change a logic level of the data having been output from the data output terminal $D_{OUT}$. That is, the intermediate potential is set to a level higher than the lowest level defining the high-level potential and lower than the potential of the power source. In order to obtain such a potential $V_2$, the resistance of the resistor R1 which determines the potential $V_1$ should be appropriately set.

A description will now be given, with reference to FIG. 2, of an operation of the output circuit 1.

When the signal at the internal signal input terminal $D_{IP}$ rises (refer to FIG. 2-(a)), the pulse signal having the width T2 (high-level signal) is output from the one-shot pulse generating circuit 5 (refer to FIG. 2-(c)). Thereby, the P-channel MOS transistor MP3 is turned off and the N-channel MOS transistor MN2 is turned on. Accordingly, a current flows through the path from the resistor R1 to the N-channel MOS transistor MN2. Thus, the potential at a junction B is changed (refer to FIG. 2-(d)). The potential $V_1$ at the junction C appears as a value obtained by subtracting the threshold value $V_{TH}$ of the N-channel MOS transistor MN3 from the potential at the junction B (refer to FIG. 2-(e)). The N-channel MOS transistor MN3 is maintained to be an off-state during a period from a time when the N-channel MOS transistor MN2 is changed from an off-state to an on-state and to a time when the potential at the junction C is decreased to the potential $V_1$. Accordingly, there is an advantage that the potential at the junction C is decreased to the potential $V_1$ at a high speed. When the potential of the junction C becomes the potential $V_1$, the P-channel MOS transistor MP2 is turned on which results in a discharge of the capacitor 3 to the ground GND. Thus, the potential at the data output terminal $D_{OUT}$ is decreased to a level of the potential $V_2$. After the period T2 has passed, the potential of each of the junctions A, B and C returns to the level before the pulse signal was input. Thereby the P-channel MOS transistor MP2 is turned off. Thus, the potential $V_2$ is maintained by the capacitor 3, that is, the data output terminal $D_{OUT}$ is maintained at the level of the potential $V_2$. Then, after the period T1 has passed, the potential of the data input terminal $D_{IN}$ becomes the high level, and the potential of the data output terminal $D_{OUT}$ is changed from the level of the potential $V_2$ to the low level (refer to FIG. 2-(f)).

As mentioned above, according to the present embodiment, the intermediate potential can be set to a level which does not change the logic level of the data having being output from the data output terminal. Thus, there is no problem in that the output holding time is reduced. Additionally, there is no problem in that a current flows in an input part of a circuit which receives the signal from the data output terminal. Further, since the intermediate potential is responsive to the output value before the address change, there is no problem in that the operation current is increased which tends to occur in the structure in which the intermediate potential is set to a fixed value without being responsive to the output value before an address change. Additionally, there is no problem occurring in the conventional circuit which uses a preset potential determined by a pulse width (preset period) of a read control signal for a memory as the intermediate potential. That is, a problem can be eliminated in which it is difficult to set the intermediate potential within a range in which the logic level is not deteriorated due to the fact that the preset potential, which is rendered to be the intermediate potential, is determined by the preset period.

A description will now be given of a second embodiment of the present invention. The second embodiment is related to a structure which operates for a condition in which low-level data is switched to high-level data.

Figure 4:
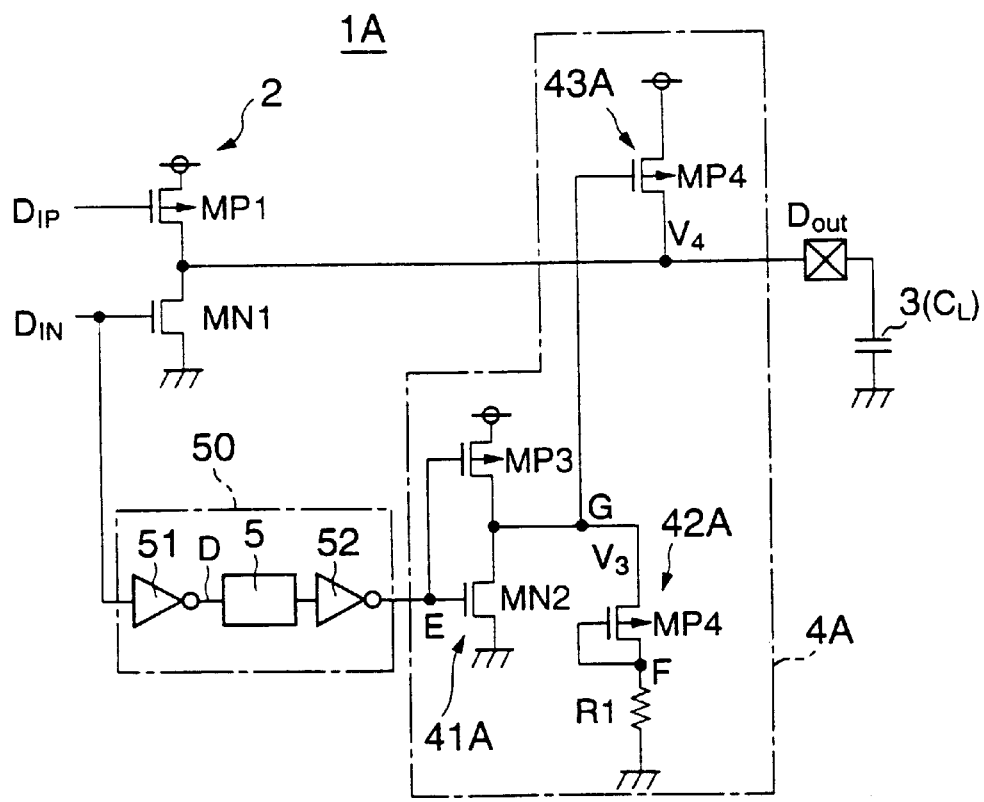
FIG. 4 is a circuit diagram of an output circuit according to a second embodiment of the present invention.
Figure 5:
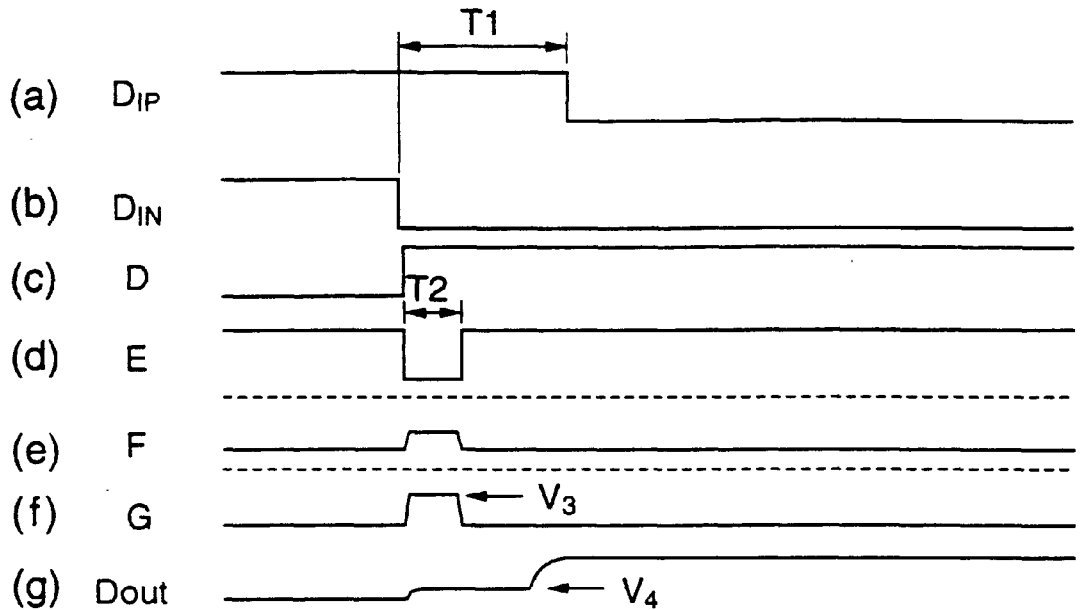
FIG. 5 is a time chart of signals at various positions in the output circuit shown in FIG. 4.

FIG. 4 is a circuit diagram of an output circuit 1A according to the second embodiment of the present invention. FIG. 5 is a time chart of signals at various positions in the output circuit 1A shown in FIG. 4. In FIG. 4, parts that are the same as the parts shown in FIG. 1 are given the same reference numerals, and descriptions thereof will be omitted.

The output circuit 1A shown in FIG. 4 comprises the output buffer circuit 2, a potential switching circuit 4A and a one-shot pulse generating circuit 50. The output terminal $D_{OUT}$ (output pin) has a capacitance $C_L$. Hereinafter, for the sake of convenience, it is assumed that a capacitor 3 having the capacitance $C_L$ is connected to the output terminal $D_{OUT}$.

The one-shot pulse generating circuit 50 generates, as shown in FIG. 5-(d), a pulse signal (low level) in synchronization with a falling edge of the signal at the internal signal input terminal $D_{IP}$, that is, the signal input to the gate of the N-channel transistor MN1. The pulse signal has a width (duration) $T_2$ that is shorter than the period of the high-impedance state. The one-shot pulse generating circuit 50 comprises the one shot pulse generating circuit 5 and inverters 51 and 52. The inverter 51 is connected to an input of the one-shot pulse generating circuit 5, and the inverter 52 is connected to an output of the one-shot pulse generating circuit 5.

The potential switching circuit 4A comprises an inverter circuit 41A, a pull-up circuit 42A, and an intermediate potential providing circuit 43A. When the potential switching circuit 4A inputs the pulse signal from the one-shot pulse generating circuit 50, the potential switching circuit 4 sets the data output terminal $D_{OUT}$ to the intermediate potential $V_4$. Then, after the duration T2 of the pulse signal is passed, the capacitor 3 holds the intermediate potential $V_4$.

The inverter circuit 41A comprises a P-channel MOS transistor MP3 and an N-channel MOS transistor circuit MN2 connected in series in that order between the power source $V_{CC}$ and the ground GND. A junction between the drains of the transistors MP3 and MN2 is rendered to be an output terminal G. A junction between the gates of the transistors MP3 and MN2 is rendered to be an input terminal E. The pulse signal of the one-shot pulse generating circuit 50 is input to the input terminal E. When the pulse signal of the one-shot pulse generating circuit 50 is not input to the terminal E, the N-channel MOS transistor MN2 is turned on. Thereby, the potential at the output terminal G is substantially equal to the potential of the ground GND. However, when the pulse signal (low-level signal) of the one-shot pulse generating circuit 50 is input to the input terminal E, the N-channel MOS transistor NM2 is turned off. Accordingly, the potential at the output terminal G is determined by the pull-up circuit 42A.

The pull-up circuit 42A comprises a resistor R1 and a P-channel MOS transistor MP4 connected in series in that order between the ground GND and the output terminal G of the inverter circuit 41A. A voltage $V_3$ provided to the output terminal G by the pull-up circuit 42A is determined by a resistance of the resistor R1 and a resistance of each of the P-channel MOS transistors MP3 and MP4 when the P-channel MOS transistor MP3 is turned on and a DC current flows through a path routing the power source $V_{CC}$→the P-channel MOS transistor MP3→the P-channel MOS transistor MP4→the resistor R1→the ground GND.

The intermediate potential providing circuit 43A comprises an N-channel MOS transistor MN4. A drain of the N-channel MOS transistor MN4 is connected to the power source $V_{CC}$. A gate of the N-channel MOS transistor MN4 is connected to the output terminal G. A source of the N-channel MOS transistor MN4 is connected to the output terminal of the output buffer circuit 2, that is, the data output terminal $D_{OUT}$. The intermediate voltage $V_4$, which is a potential at the data output terminal $D_{OUT}$ when the output buffer circuit 2 is in the high-impedance state, is provided by the N-channel MOS transistor MN4. Specifically, when the output terminal of the output buffer circuit 2 is in the high-impedance state, the P-channel MOS transistor MP3 is turned on and the voltage $V_3$ is provided to the gate of the N-channel MOS transistor MN4. A value obtained by summing the potential $V_3$ and a threshold value $V_{TH}$ of the N-channel MOS transistor MN4 is the potential $V_4$. The potential $V_4$ corresponds to the intermediate potential which does not change a logic level of the data having been output from the data output terminal $D_{OUT}$. That is, the intermediate potential is set to a level lower than the highest level defining the low-level potential and higher than the ground level. In order to obtain such a potential $V_4$, the resistance of the resistor R1 which determines the potential $V_3$ should be appropriately set.

A description will now be given, with reference to FIG. 5, of an operation of the output circuit 1A.

The signal at the data input terminal DIN falls (refer to FIG. 5-(b)) a period T1 before the signal at the internal signal input terminal $D_{IP}$ falls (refer to FIG. 5-(a)). When the signal at the data input terminal $D_{IN}$ falls, an output D of the inverter 51 in the one-shot pulse generating circuit 50 is raised (refer to FIG. 5-(c)). Thus, the pulse signal having the width T2 (low-level period) is output from the one-shot pulse generating circuit 50 (refer to FIG. 5-(d)). Thereby, the P-channel MOS transistor MP3 is turned on and the N-channel MOS transistor MN2 is turned off. Accordingly, a current flows through the path from the P-channel MOS transistor MP3 to the resistor R1. Thus, the potential at a junction F is changed (refer to FIG. 2-(e)). The potential $V_3$ at the junction G appears as a value obtained by summing the potential at the junction F and the threshold value $V_{TH}$ of the P-channel MOS transistor MP4 (refer to FIG. 2-(f)). When the potential of the junction G becomes the potential $V_3$, the N-channel MOS transistor MN4 is turned on which results in a charge of the capacitor 3. Thus, the potential at the data output terminal $D_{OUT}$ is increased to a level of the potential $V_4$. After the period T2 has been passed, the potential of each of the junctions E, F and G returns to the level before the pulse signal was input. Thereby the N-channel MOS transistor MN4 is turned off. Thus, the potential $V_4$ is maintained by the capacitor 3, that is, the data output terminal $D_{OUT}$ is maintained at the level of the potential $V_4$. Then, after the period T1 has passed, the potential of the internal signal input terminal $D_{IP}$ becomes the low level, and the potential at the data output terminal $D_{OUT}$ is changed from the level of the potential V4 to the high level (refer to FIG. 5-(g)).

Figure 6:
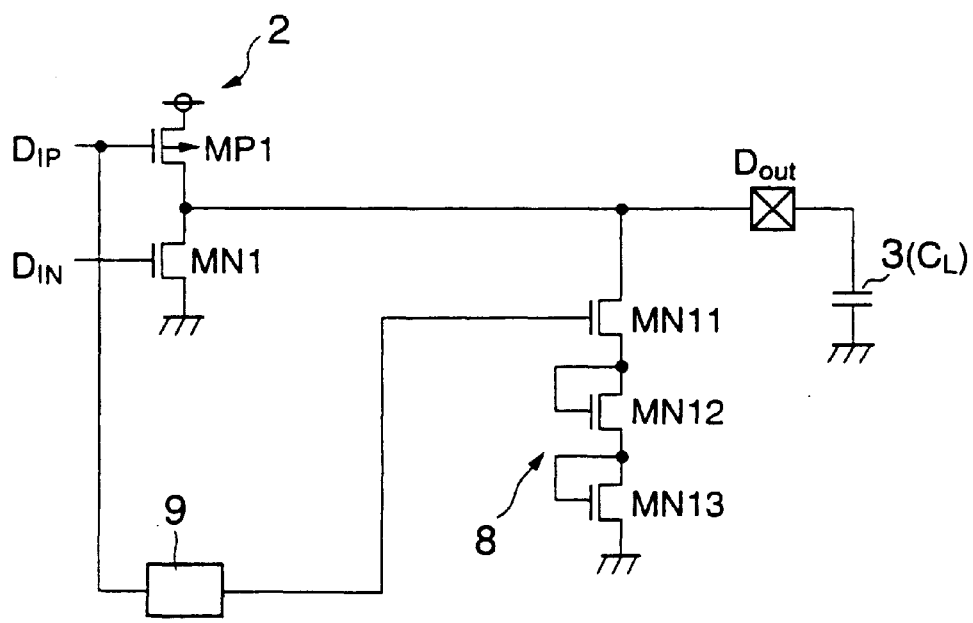
FIG. 6 is a circuit diagram of an output circuit according to a third embodiment of the present invention.

A description will now be given, with reference to FIG. 6, of a third embodiment of the present invention. Similar to the above-mentioned first embodiment, the third embodiment is related to a structure which operates for a condition in which high-level data is switched to low-level data. FIG. 6 is a circuit diagram of an output circuit according to the third embodiment of the present invention. In FIG. 6, parts that are the same as the parts shown in FIG. 1 are given the same reference numerals, and descriptions thereof will be omitted.

The output circuit shown in FIG. 6 comprises a one-shot pulse generating circuit 9 having a structure similar to the one-shot pulse generating circuit 5 shown in FIG. 1. The one-shot pulse generating circuit 9 generates a pulse signal having a predetermined width in synchronization with a rising of the signal input to the gate of the P-channel MOS transistor MP1.

The output circuit shown in FIG. 6 comprises a potential switching circuit 8 instead of the potential switching circuit 5 shown in FIG. 1. The potential switching circuit 8 comprises three N-channel MOS transistors MN11, MN12 and MN13 provided between the data output terminal $D_{OUT}$ and the ground GND. The potential switching circuit 8 is activated when the pulse signal is input to a gate of the N-channel MOS transistor MN11 so as to discharge the capacitor 3 of the data output terminal $D_{OUT}$ based on threshold potentials of the N-channel MOS transistors MN11, MN12 and MN13.

According to the above-mentioned structure, an intermediate potential having a desired level can be provided to the data output terminal $D_{OUT}$ based on the threshold potentials of the N-channel MOS transistors MN11, MN12 and MN13. Additionally, a fine adjustment of the level of the intermediate potential can be performed, if necessary, by adjusting the pulse width of the pulse signal output by the one-shot pulse generating circuit 9.

Figure 7:
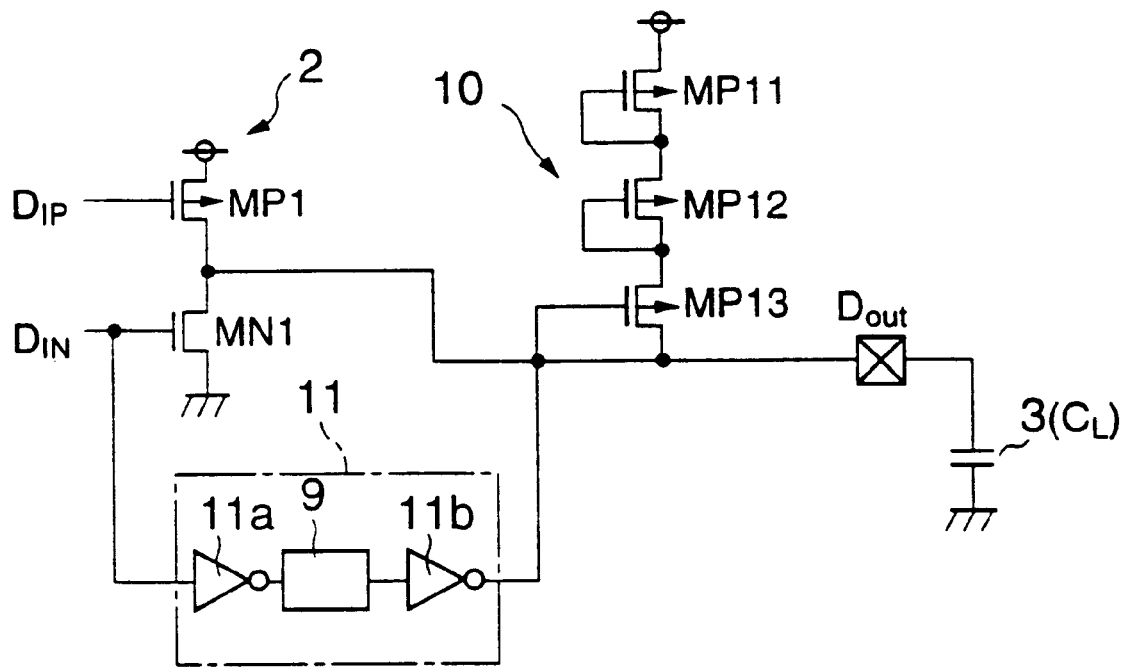
FIG. 7 is a circuit diagram of an output circuit according to a fourth embodiment of the present invention.

A description will now be given, with reference to FIG. 7, of a fourth embodiment of the present invention. Similar to the above-mentioned second embodiment, the fourth embodiment is related to a structure which operates for a condition in which low-level data is switched to high-level data. FIG. 7 is a circuit diagram of an output circuit according to the fourth embodiment of the present invention. In FIG. 7, parts that are the same as the parts shown in FIG. 6 are given the same reference numerals, and descriptions thereof will be omitted.

The output circuit shown in FIG. 7 comprises a one-shot pulse generating circuit 11 instead of the one-shot pulse generating circuit 9 shown in FIG. 6. The one-shot pulse generating circuit 11 comprises the one-shot pulse generating circuit 9 and inverters 11a and 11b. The inverter 11a is connected to an input of the one-shot pulse generating circuit 9, and the inverter 11b is connected to an output of the one-shot pulse generating circuit 9. The one-shot pulse generating circuit 11 generates a pulse signal having a predetermined width in synchronization with a rising of the signal input to the gate of the N-channel MOS transistor MN1.

The output circuit shown in FIG. 7 comprises a potential switching circuit 10 instead of the potential switching circuit 9 shown in FIG. 6. The potential switching circuit 10 comprises three P-channel MOS transistors MP11, MP12 and MP13 provided between the power source $V_{CC}$ and the data output terminal $D_{OUT}$. The potential switching circuit 10 is activated when the pulse signal is input to a gate of the P-channel MOS transistor MP13 which is connected to the data output terminal $D_{OUT}$ so as to charge the capacitor 3 of the data output terminal $D_{OUT}$ based on threshold potentials of the P-channel MOS transistors MP11, MP12 and MP13.

According to the above-mentioned structure, an intermediate potential having a desired level can be provided to the data output terminal $D_{OUT}$ based on the threshold potentials of the P-channel MOS transistors MP11, MP12 and MP13. Additionally, a fine adjustment of the level of the intermediate potential can be performed, if necessary, by adjusting the pulse width of the pulse signal output by the one-shot pulse generating circuit 11.

The present invention is not limited to the specifically disclosed embodiments, and variations and modifications may be made without departing from the scope of the present invention.

The present application is based on Japanese priority application No.9-179241 filed on Jul. 4, 1997, the entire contents of which are hereby incorporated by reference.

What is claimed is:

1. An output circuit outputting data represented by one of a high-level potential and a low-level potential, the output circuit having a data input terminal, a data output terminal and an output buffer circuit provided between the data input terminal and the data output terminal, an output of the output buffer circuit being connected to the data output terminal, the data output terminal being set to a high-impedance state for a predetermined period when the output buffer circuit switches a potential at the data output terminal, said output circuit comprising:

a pulse outputting circuit outputting a pulse when said data output terminal is set to the high-impedance state; and a potential switching circuit changing a potential of said data output terminal to an intermediate potential before the potential at said data output terminal is switched from one of the high-level potential and the low-level potential to the other when the pulse signal is supplied by said pulse outputting circuit so that the intermediate potential is held by a capacitance of said data output terminal, the intermediate potential being set to a level within an allowable range for a level of one of said high-level potential and said low-level potential.

2. The output circuit as claimed in claim 1, wherein said intermediate potential is higher than a lowest level defining said high-level potential and lower than a potential of a power source.

3. The output circuit as claimed in claim 2, wherein said output buffer circuit comprises a P-channel transistor and an N-channel transistor so as to change the potential at said data output terminal to said high-level potential by operating said P-channel transistor and change the potential at said data output terminal to said low-level potential by operating said N-channel transistor; said pulse outputting circuit generates said pulse for a predetermined period shorter than a period of said high-impedance state in synchronization with a rising of a signal input to a gate of said P-channel transistor; and said potential switching circuit discharges a charge maintained by the capacitance of said data output terminal when said pulse is supplied thereto.

4. The output circuit as claimed in claim 3, wherein said potential switching circuit comprises:

an inverter circuit comprising a P-channel transistor and an N-channel transistor connected in series in that order between a power source and a ground, said pulse output from said pulse outputting circuit being input to an input of said inverter circuit;

a pull-up circuit provided between said power source and an output of said inverter circuit so as to provide a predetermined potential to said output of said inverter circuit; and a discharging circuit provided between said output of said inverter circuit and said output of said output buffer circuit so as to discharge the charge held by the capacitance of said data output terminal so that the potential at said data output terminal is changed to said intermediate potential.

5. The output circuit as claimed in claim 2, wherein said output buffer circuit comprises a P-channel transistor and an N-channel transistor so as to change the potential at said data output terminal to said high-level potential by operating said P-channel transistor and change the potential at said data output terminal to said low-level potential by operating said N-channel transistor; said pulse outputting circuit generates said pulse having a predetermined width in synchronization with a rising of a signal input to a gate of said P-channel transistor; and said potential switching circuit comprises a plurality of N-channel transistors, said potential switching circuit being activated by said pulse being input to a gate of one of said N-channel transistors so as to discharge a charge held by the capacitance of said data output terminal based on threshold potentials of said N-channel transistors.

6. The output circuit as claimed in claim 1, wherein said intermediate potential is lower than a highest level defining said low-level potential and higher than a ground level.

7. The output circuit as claimed in claim 6, wherein said output buffer circuit comprises a P-channel transistor and an N-channel transistor so as to change the potential at said data output terminal to said high-level potential by operating said P-channel transistor and change the potential at said data output terminal to said low-level potential by operating said N-channel transistor; said pulse outputting circuit generates said pulse for a predetermined period shorter than a period of said high-impedance state in synchronization with a falling of a signal input to a gate of said N-channel transistor; and said potential switching circuit charges the capacitance of said data output terminal when said pulse is supplied thereto.

8. The output circuit as claimed in claim 7, wherein said potential switching circuit comprises:

an inverter circuit comprising a P-channel transistor and an N-channel transistor connected in series in that order between a power source and a ground, said pulse output from said pulse outputting circuit being input to an input of said inverter circuit;

a potential setting circuit provided between said ground and an output of said inverter circuit so as to set said output of said inverter circuit to a predetermined potential; and a charging circuit provided between said output of said inverter circuit and said output of said output buffer circuit so as to charge the capacitance of said data output terminal based on said predetermined potential so that the potential at said data output terminal is changed to said intermediate potential.

9. The output circuit as claimed in claim 6, wherein said output buffer circuit comprises a P-channel transistor and an N-channel transistor so as to change the potential at said data output terminal to said high-level potential by operating said P-channel transistor and change the potential at said data output terminal to said low-level potential by operating said N-channel transistor; said pulse outputting circuit generates said pulse having a predetermined width in synchronization with a falling of a signal input to a gate of said N-channel transistor; and said potential switching circuit comprises a plurality of P-channel transistors, said potential switching circuit being activated by said pulse being input to a gate of one of said P-channel transistors so as to charge the capacitance of said data output terminal based on threshold potentials of said P-channel transistors.

* * * * *